United States Patent [19]
Fleming et al.

[11] Patent Number: 5,136,185
[45] Date of Patent: Aug. 4, 1992

[54] LOCAL TRISTATE CONTROL CIRCUIT

[75] Inventors: Lee O. Fleming, Fremont; John S. Walther, Sunnyvale, both of Calif.

[73] Assignee: Hewlett-Packard Company, Palo Alto, Calif.

[21] Appl. No.: 763,083

[22] Filed: Sep. 20, 1991

[51] Int. Cl.⁵ ............... H03K 17/16; H03K 19/173
[52] U.S. Cl. ......................... 307/443; 307/465; 307/473; 307/270
[58] Field of Search ........... 307/443, 465, 473, 270; 371/52

[56] References Cited

U.S. PATENT DOCUMENTS

| | | | |
|---|---|---|---|
| 4,587,445 | 5/1986 | Kanuma | 307/443 |
| 4,691,161 | 9/1987 | Kant et al. | 307/465 |
| 4,920,515 | 4/1990 | Obata | 307/465 |
| 5,023,485 | 6/1991 | Sweeney | 307/443 |

*Primary Examiner*—Edward P. Westin
*Assistant Examiner*—Andrew Sanders

[57] ABSTRACT

This invention improves and simplifies prior art systems for automatic test generation methodologies. In this invention, combinational logic is used to prevent opposing tristate bus drivers from simultaneously providing a logic signal on a common bus during testing of an integrated circuit. The combinational logic also ensures that at most one tristate buffer is enabled at all times during testing to ensure the common bus is at either a full logical 1, logical 0, or non-driven state. By preventing opposing drive signals being applied to the common bus and thus ensuring the bus is at a full logical 1 or logical 0 state when driven, automatic test generation programs can accurately generate test vectors for the integrated circuit.

13 Claims, 4 Drawing Sheets

LOCAL TRISTATE CONTROL CIRCUIT

FIELD OF THE INVENTION

This invention relates to integrated circuits and, in particular, to an improved design for integrated circuits containing tristate bus drivers which simplifies automatic test generation methodologies.

BACKGROUND OF THE INVENTION

A tristate bus driver (also called a tristate buffer), when enabled by an enable signal applied to its enable terminal, outputs a logical 1 or 0 signal in response a logical 1 or 0 signal applied to its input. When the tristate bus driver is not enabled by an enable signal, its output is an open circuit.

Various types of integrated circuits (IC) incorporate a plurality of tristate bus drivers connected to a common bus, where the tristate bus drivers are selectively enabled. The tristate bus drivers are typically selectively enabled so that the common bus will only be driven to a full logical 1 or a full logical 0 by a single driver.

One means of providing such driver selection is with the use of a state machine whose outputs are connected to the enable terminals of the various tristate bus drivers. In normal operation, the state machine would be programmed to generate a clocked pattern of enable signals to enable the various tristate bus drivers individually or in any sequence.

Typically, for testing the IC, a model of the IC circuitry is created using a netlist. This model is then used in conjunction with a customized automatic test generation (ATG) computer program to generate test stimuli and responses. When testing the IC, the test stimuli are applied to selected input nodes of the IC. The resulting output signals at selected output nodes of the IC are then compared with the predicted responses to determine whether the IC is operating properly.

When the IC incorporates tristate bus drivers connected to a common bus, such as tristate bus drivers 10-13 in FIG. 1a connected to common bus 15, the ATG model models these tristate bus drivers as AND gates connected to a single OR gate, such as AND gates 20-23 connected to OR gate 24 in FIG. 1b.

D-type latch 26 and modeled D-type latch 27 are shown connected to bus 15 and OR gate 24, respectively, as representative of a device receiving a signal from bus 15 or OR gate 24.

As seen from a comparison of FIGS. 1a and 1b, the ATG model models each tristate bus driver as an AND gate having two inputs, where one input receives the information signal and the other input receives the enable signal. Thus, if the enable signal is a logical 1, the output of the AND gate follows the information signal.

OR gate 24 provides a model of the common connection of the outputs of tristate bus drivers 10-13, wherein if any of the outputs of AND gates 20-23 is a logical 1, the output of OR gate 24 will be a logical 1. Conversely, if none of the outputs of AND gates 20-23 is a logical 1, the output of OR gate 24 will be a logical 0.

However, this model of FIG. 1b does not accurately reflect the level on bus 15 if two or more bus drivers 10-13 are concurrently enabled, either intentionally or inadvertently, and the outputs of the enabled drivers include both logical 1's and logical 0's. In such a case, the level of bus 15 will neither be fully a logical 1 nor a logical 0 level, while the modeled level at the output of OR gate 24 will be an ideal logical 1. Further, if none of the drivers 10-13 are enabled, bus 15 will float. This state is also not accurately modeled by OR gate 24, whose output may only be an ideal logical 1 or logical 0.

Due to such an anomaly between the operation of the actual circuitry of FIG. 1a and the ATG model of FIG. 1b, means have been incorporated in prior art IC's to cause one and only one of the actual tristate bus drivers to be enabled at a time during ATG testing. Hence, in such a case, the ATG model accurately reflects the actual tristate bus drivers 10-13, since only a full logical 1 or logical 0 can now appear on bus 15.

One such prior art means to enable only one tristate bus driver at a time is shown in FIG. 2. In FIG. 2, central decoder 30 is inserted between tristate bus drivers 10-13 and state machine 34 to only allow one of drivers 10-13 to be enabled at any one time. Since the ATG program typically is not designed to understand the IC's permissible operation modes, without decoder 30 the ATG program could undesirably generate test signals which would cause state machine 34 to concurrently enable two or more of drivers 10-13.

The disadvantages to this prior art approach shown in FIG. 2 include: (1) the additional circuit size and propagation delay incurred by routing all tristate enable signals from state machine 34 into a central decoder 30 and routing the decoder 30 outputs to the enable terminals of tristate bus drivers 10-13; (2) significant delays from the charging and discharging of the parasitic input capacitance of the decoder 30, especially if decoder 30 has a large fan-in; (3) the added complexity in designing the ATG methodology to model decoder 30; and (4) if state machine 34 is designed to provide already decoded enable signals, then application of the ATG methodology requires additional encoding and decoding of these state machine signals to ensure only one buffer is enabled at a time.

Thus, what is desirable is a circuit containing tristate bus drivers which simplifies ATG methodologies and which does not suffer from the above-described drawbacks incurred when using a central decoder or similar means to prevent simultaneous enablement of opposing bus drivers.

SUMMARY OF THE INVENTION

In the present invention, instead of prior art decoders, a different type of combinational logic is used to prevent opposing tristate buffers from simultaneously providing a signal on a common bus during automatic testing of an integrated circuit (IC).

In one embodiment, a logical 1 automatic test 0 generation (ATG) test signal, indicating an active test mode, is applied to one input of an ATG NAND gate associated with each tristate buffer downstream from a first tristate buffer. A second input of each ATG NAND gate has applied to it an upstream enable signal indicating whether an enable signal has been generated for any upstream tristate buffer.

Thus, if the ATG test mode is active and a logical 1 upstream enable signal has been generated (indicating an upstream tristate buffer is already enabled), the output of the ATG NAND gate will be a logical 0. If either or both the ATG test mode signal or the upstream enable signal is not a logical 1, the output of the ATG NAND gate will be a logical 1.

The output of the ATG NAND gate associated with a particular tristate buffer is applied to a first input of an AND gate also associated with the particular tristate buffer. An enable-in signal associated with that particular tristate buffer is applied to a second input of the AND gate.

The output of the AND gate is applied to the enable terminal of the tristate buffer. Thus, both a logical 1 enable-in signal and a logical 1 output of the ATG NAND gate are required to cause the output of the AND gate to enable the tristate buffer.

Identical circuitry is provided for each of the downstream tristate buffers, except for the most downstream buffer.

During an active ATG test mode, various ATG stimulus patterns give rise to enable-in signals being generated for enabling the various tristate buffers connected to a common bus within the IC. However, as previously stated, in the ATG test mode, the ATG program may not understand the operational conditions for the IC and may provide impermissible signals which can inadvertently enable two tristate buffers simultaneously. The above-described logic circuitry prevents two concurrently generated enable-in signals from concurrently enabling an upstream buffer and a downstream buffer, since the most upstream logical 1 enable-in signal will cause the outputs of all downstream AND gates to necessarily be a logical zero, thus disabling all downstream buffers.

Additional circuitry is provided for the most downstream buffer to be enabled if and only if all upstream buffers are disabled.

BRIEF DESCRIPTION OF THE DRAWINGS

FIG. 1b illustrates an automatic test generation model of the tristate buffers of FIG. 1a;

DETAILED DESCRIPTION OF THE PREFERRED EMBODIMENT

Figure 3:
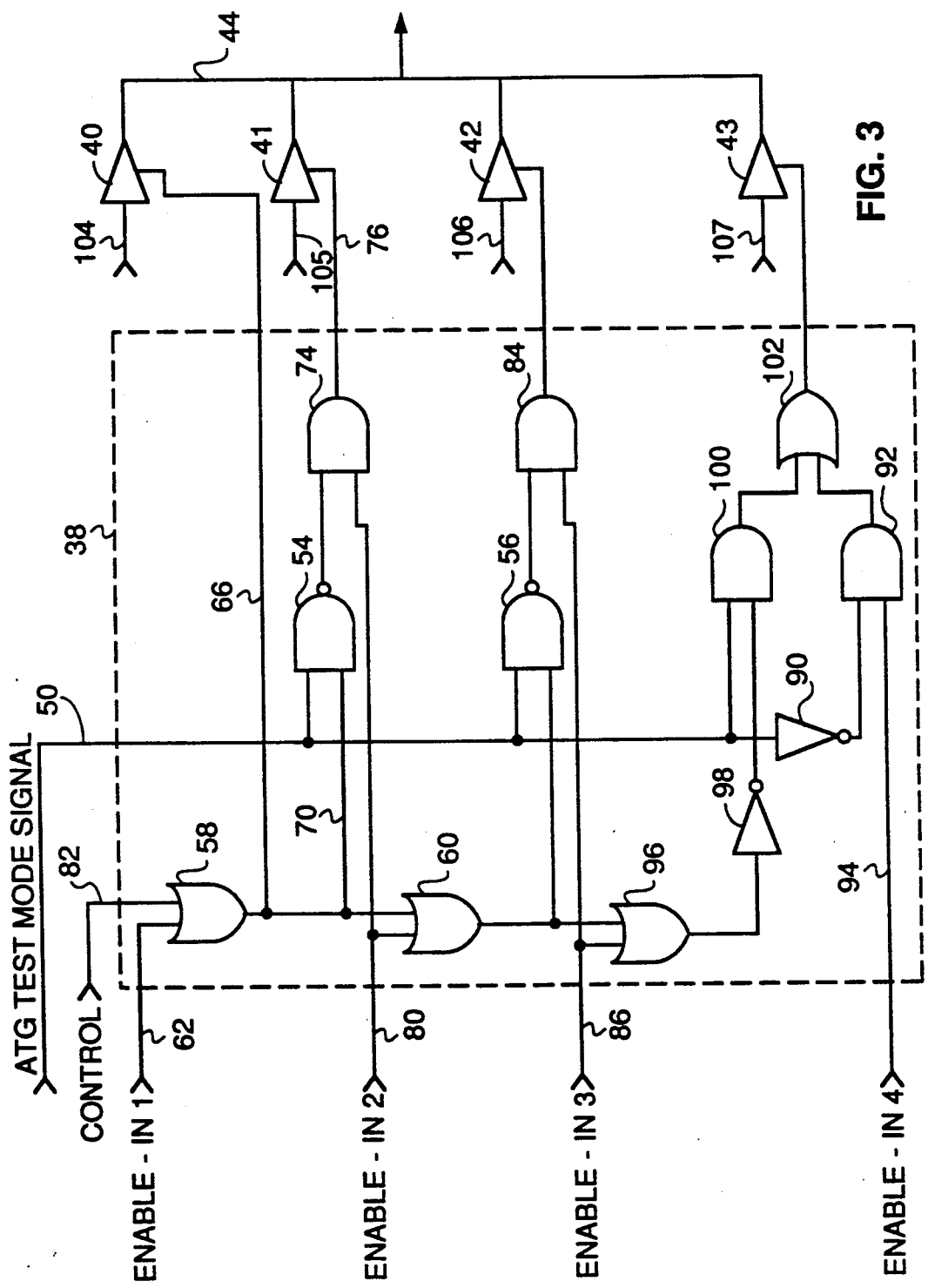
FIG. 3 illustrates one embodiment of the invention which eliminates the decoder of FIG. 2.

FIG. 3 shows a circuit illustrating one embodiment of the invention. In FIG. 3, combinational logic 38 prevents any of the downstream tristate buffers 41-43 from being enabled if an enable signal is generated for any of the upstream tristate buffers 40-42 and also ensures that one tristate buffer 40-43 is enabled at all times so that the signal on common bus 44 will either be a full logical 1 or a full logical 0. Hence, bus 44 is prevented from either floating or from having opposing signals applied to it from two or more concurrently enabled tristate buffers 40-43.

Figure 1A:
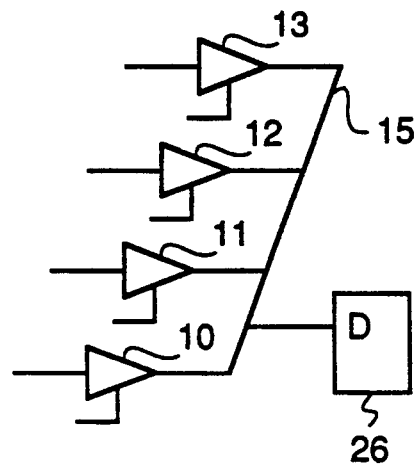
FIG. 1a illustrates tristate buffers connected to a common bus.
Figure 1B:
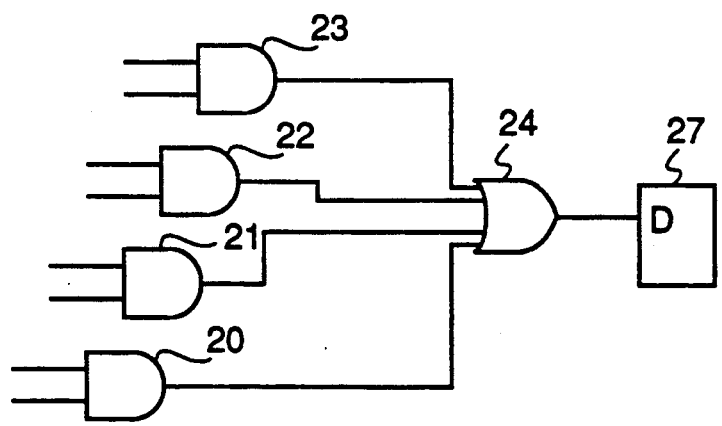
Figure 2:
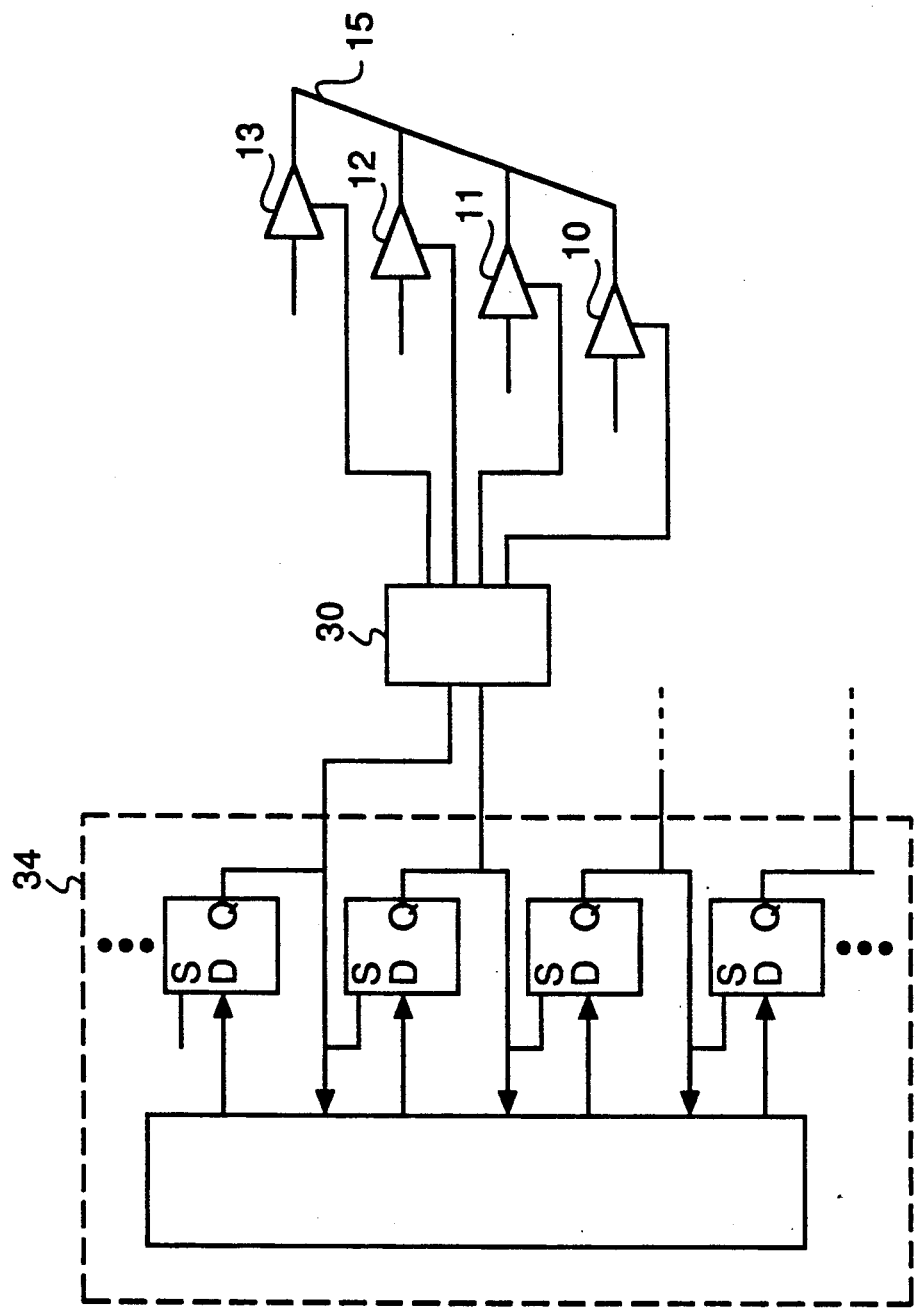
FIG. 2 illustrates one prior art design incorporating a decoder for ensuring the output of the scanned state machine enables only a single tristate buffer at a time during a test mode.

As previously discussed, by providing such limitations on enabling tristate buffers 40-43, the ATG model will accurately reflect the performance of the circuit shown in FIG. 3, where the ATG model of tristate buffers has been previously shown in FIG. 1b.

ATG Test Mode Signal High, Enablement of Buffers 40 and 41

In operation, when the ATG test mode is active and the circuit of FIG. 3 is undergoing a test, a logical 1 signal is generated on ATG test mode signal line 50. When the circuit is not undergoing a test, the signal on line 50 will be a logical 0. It is to be noted that the various logic signal levels mentioned herein may be inverted with the appropriate changes in logic 38 while still achieving identical results.

The logical 1 signal on line 50 is applied to an input of NAND gates 54 and 56, associated with downstream tristate buffers 41 and 42, respectively.

Connected to a second input of NAND gates 54 and 56 are the outputs of OR gates 58 and 60, respectively.

Applied to one input of OR gate 58 is an enable-in1 signal generated by any appropriate means, such as a state machine, for enabling or disabling tristate buffer 40. Assuming a logical 1 enable-in1 signal is applied to a first input of OR gate 58 via line 62, the output of OR gate 58 will necessarily be a logical 1. This logical 1 is directly applied to the enable terminal of tristate buffer 40 via line 66 so as to enable tristate buffer 40, and is also applied to a second input of NAND gate 54 via line 70. Hence, when tristate buffer 40 is enabled during an active test mode NAND gate 54 has two logical 1 signals applied to its inputs. As seen by the truth table below for a NAND gate, the output of NAND gate 54, having only logical 1 inputs, is a logical 0.

TABLE 1

| A | B | NAND |
|---|---|------|
| 0 | 0 | 1 |
| 0 | 1 | 1 |
| 1 | 0 | 1 |
| 1 | 1 | 0 |

The output of NAND gate 54 is applied to one input of AND gate 74, whose output is connected to an enable terminal of downstream tristate buffer 41 via line 76. The logical 0 output of NAND gate 54 necessarily causes the output of AND gate 74 to be a logical 0, and hence, causes downstream tristate buffer 41 to be disabled regardless of the level of an enable in2 signal applied to a second input of AND gate 74 via line 80. Thus, due to the logical 1 enable-in1 signal on line 62, upstream tristate buffer 40 is automatically enabled, while downstream tristate buffer 41 is automatically disabled during an ATG active test mode.

During an active test mode, if the enable-in1 signal is a logical 0, and the optional control signal (which could be a scan control signal) on line 82 is a logical 0, the output of OR gate 58 will be a logical 0. This logical 0 applied to an input of NAND gate 54 via line 70 necessarily causes the output of NAND gate 54 to be a logical 1. Thus, the output of AND gate 74 will follow the enable-in2 signal to enable or disable tristate buffer 41.

The control signal applied to line 82 as a second input into OR gate 58 controls the first upstream tristate buffer 40 to become enabled regardless of the state of the enable-in1 signal on line 62. A logical 1 control signal applied to line 82 may be generated by any means to cause tristate buffer 40 to be enabled so as to drive bus 44 to a given level. If the added flexibility provided by a control signal on line 82 is not desired, OR gate 58 may be deleted and line 62 may be shorted to line 66.

ATG Test Mode Signal Low, Enablement of Buffer 41

If the ATG test mode signal on line 50 is a logical 0, indicating that the circuit is being operated normally and is not under test, the output of NAND gate 54 will automatically be a logical 1, as seen from Table 1, and the output of AND gate 74 will follow the level of the enable-in2 signal applied to line 80, regardless of the level of the enable-in1 signal or any other enable-in signals.

ATG Test Mode Signal High or Low, Enablement of Buffer 42

The operation of NAND gate 56 and AND gate 84, associated with downstream tristate buffer 42, have functions similar to NAND gate 54 and AND gate 74, respectively. With regard to the enabling of tristate buffer 42 during an active test mode, if the output of OR gate 60 is a logical 1, indicating an upstream tristate buffer has been enabled, this logical 1 is applied to an input of NAND gate 56 along with the logical 1 on line 50. The output of NAND gate 56 will thus be a logical 0, causing the output of AND gate 84 to necessarily be a logical 0 regardless of the state of the enable-in3 signal on line 86. Hence, tristate buffer 42 will be disabled.

If, on the other hand, the output of OR gate 60 is a logical 0, indicating that no upstream tristate buffers are enabled, the output of NAND gate 56 will necessarily be a logical 1, and the output of AND gate 84 will follow the logic level of the enable-in3 signal to enable or disable tristate buffer 42.

If the ATG test mode signal on line 50 is a logical 0, the output of NAND gate 56 will necessarily be a logical 1, and the output of AND gate 84 will follow the logic level of the enable-in3 signal.

ATG Test Mode signal High, Enablement of Buffer 43 in FIG. 3

Since it is desired to have only one tristate buffer 40–43 to be enabled and to not have bus 44 floating due to all tristate buffers 40–43 being disabled, special circuitry is provided for automatically enabling the most downstream tristate buffer 43 in the event none of the upstream tristate buffers 40–42 are enabled.

If the ATG test mode signal on line 50 is a logical 1, indicating an active test mode, this logical 1 signal is inverted by invertor 90 to apply a logical 0 to a first input of AND gate 92, causing the output of AND gate 92 to be a logical 0 regardless of the state of the enable-in4 signal on line 94.

If none of the upstream tristate buffers 40–42 are enabled, logical 0 signals are applied to both inputs of OR gate 96, causing the output of OR gate 96 to also be a logical 0. This logical 0 output of OR gate 96 is inverted by invertor 98, which then supplies a logical 1 to a first input of AND gate 100. The ATG test mode signal on line 50, also a logical 1, is applied to a second input of AND gate 100. Consequently, the output of AND gate 100 will be a logical 1 during this time when no upstream tristate buffers 40–42 are enabled during an active test mode. This logical 1, is ORed by OR gate 102 with the logical 0 output of AND gate 92, and OR gate 102 thus supplies a logical 1 signal to the enable terminal of tristate buffer 43. Thus, the most downstream tristate buffer 43 is automatically enabled if none of the upstream tristate buffers 40–42 are enabled during an active rest mode.

ATG Test Mode signal Low, Enablement of Buffer 43 in FIG. 3

If the circuit is not being tested, the ATG test mode signal on line 50 will be a logical 0. This logical 0 is inverted by invertor 90, causing a logical 1 to be applied to a first input of AND gate 92. A second input into AND gate 92 is the enable-in4 signal, as previously discussed, being generated by any means, such as a state machine. Thus, the output of AND gate 92 follows the enable-in4 signal when the circuit is not being tested.

The output of AND gate 92 is applied to one input of OR gate 102, whose output is coupled to the enable terminal of tristate buffer 43. Thus, when the test mode is inactive, the output of OR gate 102 will effectively follow the logic level of the enable-in4 signal.

Information signals of a logical 1 or logical 0 are applied to input lines 104–107 of tristate buffers 40–43, respectively. These information signals are generated by any well known means.

Accordingly, one embodiment of the invention has been described. Many more tristate buffers may be included in the circuit of FIG. 3, and the portions of logic circuitry 38 associated with buffers 41 or 42 may be duplicated for these additional tristate buffers. Further, other appropriate circuitry may be used for ensuring that the most downstream tristate buffer 43 is automatically enabled during the test mode if none of the upstream tristate buffers 40–42 are enabled.

Figure 4:
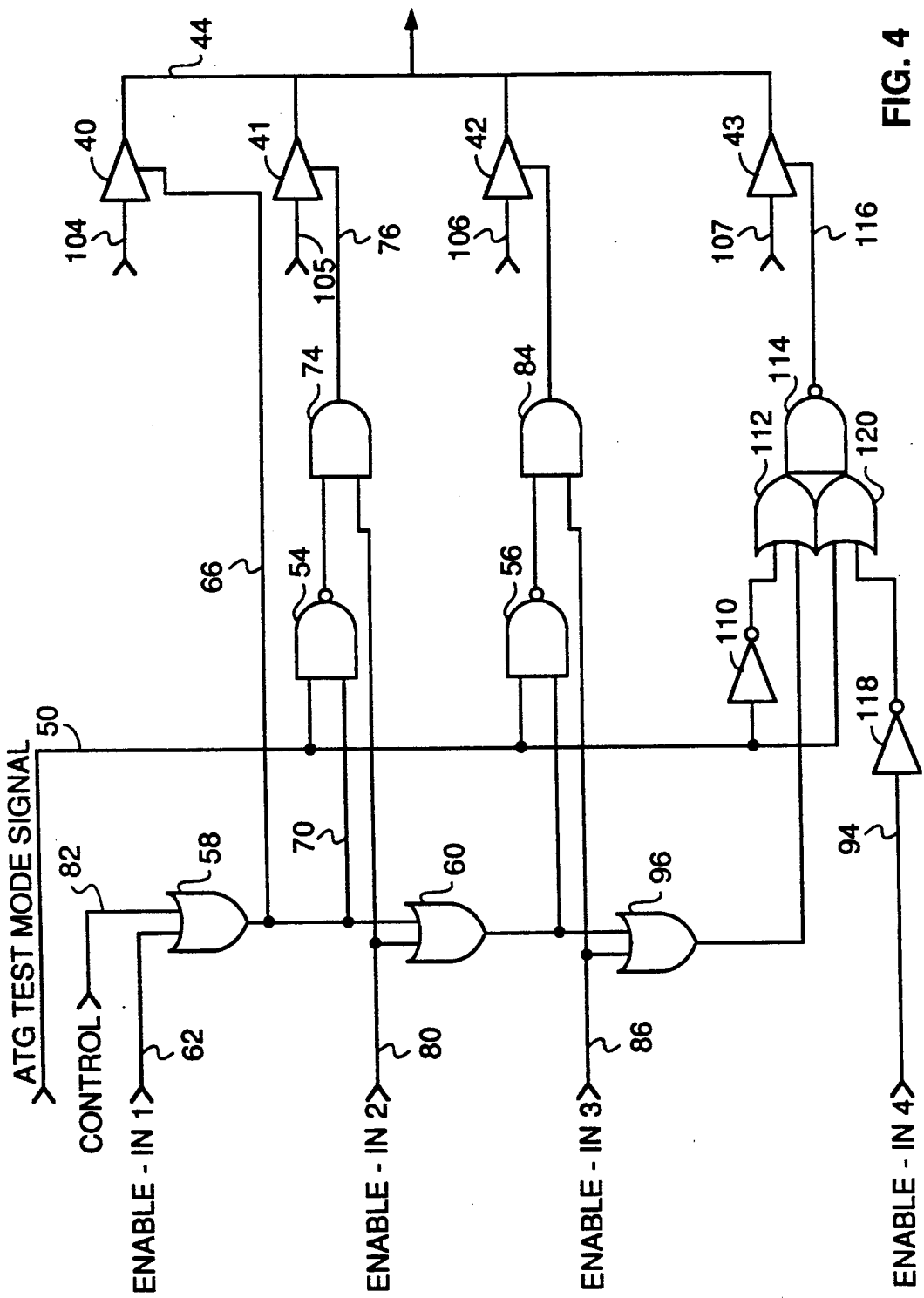
FIG. 4 illustrates a preferred embodiment of the invention.

ATG Test Mode signal High, Enablement of Buffer 43 in FIG. 4

FIG. 4 illustrates a second and preferred embodiment of the invention wherein the circuitry associated with the most downstream tristate buffer 43 is different from that shown in FIG. 3. The remainder of the circuit is identical to that of FIG. 3.

In FIG. 4, during an active test mode when the signal on line 50 is a logical 1 if no upstream tristate buffers 40–42 have been enabled, the output of OR gate 96 will be a logical 0. The logical 1 on line 50 is inverted by invertor 110 so as to apply a logical 0 to a first input of OR gate 112, where a second input of OR gate 112 is the logical 0 output of OR gate 96. The logical 0 output of OR gate 112 is applied to a first input of NAND gate 114, thus, necessarily causing the output of NAND gate 114 to be a logical 1 so as to enable tristate buffer 43 via line 116. Hence, in this active test mode, tristate buffer 43 is enabled regardless of the logic state of the enable-in4 signal when none of tristate buffers 40–42 are enabled.

When the test mode signal on line 50 is a logical 1, indicating an active mode, but one of the upstream tristate buffers 40–42 is enabled, an output of OR gate 96 is automatically a logical 1. This will cause the output of OR gate 112 to necessarily be a logical 1. The logical 1 signal on line 50 applied to an input of OR gate 120 causes OR gate 120 to apply a logical 1 to an input of NAND gate 114. NAND gate 114 now has two logical 1 inputs and consequently applies a logical 0 to the enable terminal of tristate buffer 43, disabling tristate buffer 43. In this case, during an active test mode, tristate buffer 43 is disabled regardless of the state of the enable-in4 signal due to one of the upstream tristate buffers 40–42 being enabled.

ATG Test Mode Signal Low, Enablement of Buffer 43 in FIG. 4

If the ATG test mode signal on line 50 is a logical 0, indicating that the test mode is inactive, invertor 110 inverts this logical 0 signal on line 50 and applies a logical 1 to the first input of OR gate 112. Hence, the output of OR gate 112 will necessarily be a logical 1. A logical 1 or logical 0 enable-in4 signal applied to line 94 is inverted by invertor 118 so as to apply a logical 0 or logical 1 signal to a first input of OR gate 120. A second input into OR gate 120 is the signal on line 50, which is a logical 0 in this inactive test mode. Thus, the output of OR gate 120 follows the inverse of the enable-in4 signal.

Hence, during this inactive test mode, NAND gate 114 has a logical 1 signal applied to one input by OR gate 112 and an inverse of the enable-in4 signal applied to its other input. Therefore, if the enable-in4 signal is a logical 1, the output of NAND gate 114 will be a logical 1 so as to enable tristate buffer 43 during this test inactive mode. If the enable-in4 signal is a logical 0, the resulting logical 0 output of NAND gate 114 will disable tristate buffer 43.

Conclusion

Advantages of this invention over the prior art include:
1. Less performance impact on enable signals.
2. Takes up less area than a decoder.
3. No need to route signals to a central decoder; this results in less signal delay and less silicon impact.
4. More modular construction, which allows individual bits to be added, instead of powers of two. For example, to decode nine signals would require using a 4:16 decoder instead of a 3:8 decoder and would waste 7 bits if implemented with a non-custom library cell.
5. If a state machine outputs incorrectly decoded signals (i.e., the signals fail the test methodology rules), then the signals must be encoded and then decoded in adherence to the test methodology rules. The additional encoding and decoding adds silicon and delay.

Because the added circuitry associated with the most downstream tristate buffer 43 in FIGS. 3 and 4 adds more delay than the circuitry associated with the other tristate buffers, the tristate buffer that is chosen to be the most downstream one should be the one whose enable signal is the least timing critical.

It will be obvious to those of ordinary skill in the art to substitute other logic circuits for those shown in FIGS. 3 and 4 if tristate buffer 40-43 were enabled upon a logical 0 enable signal applied to their enable terminals. Further, equivalent circuitry may be used to implement the logic functions provided by the circuits of FIG. 3 and FIG. 4.

Additionally, the terms upstream and downstream are not intended to refer to any relative physical positions of the tristate buffers, but only to the relative priorities given to the buffers. The term tristate buffer may also apply to any similar means enabled by a signal for driving a bus to a high, low, or undriven state.

While particular embodiments of the present invention have been shown and described, it will be obvious to those of ordinary skill in the art that changes and modifications may be made without departing from this invention and its broader aspects and, therefore, the appended claims are to encompass within their scope all such changes and modifications as fall within the true spirit and scope of this invention.

What is claimed is:

1. In a circuit including tristate buffers having outputs connected to a common bus, an improvement comprising:
    combinational logic means, responsive to a test mode signal indicating an active test mode, for causing at most one of said tristate buffers connected to said common bus to be enabled at any one time during said active test mode.

2. The circuit of claim 1 wherein said combinational logic comprises:
    a first logic means associated with a first downstream tristate buffer for preventing enablement of said first downstream tristate buffer upon enablement of any upstream tristate buffer.

3. The circuit of claim 2 wherein said first logic means comprises:
    a first NAND gate having a first input coupled to receive said test mode signal and a second input coupled to receive a signal indicating enablement of any upstream tristate buffer; and
    a first AND gate having a first input coupled to an output of said first NAND gate and having a second input coupled to a first enable signal associated with said first downstream tristate buffer, an output of said first AND gate being coupled to an enable terminal of said first downstream tristate buffer.

4. The circuit of claim 3 wherein said second input of said NAND gate is coupled to an output of a first OR gate, wherein said first OR gate has a first input coupled to a second enable signal associated with a first upstream tristate buffer and has a second input coupled to receive a signal indicating enablement of a second upstream tristate buffer.

5. The circuit of claim 2 wherein said combinational logic further comprises:
    a second logic means associated with a furthest downstream tristate buffer for preventing enablement of said furthest downstream tristate buffer upon enablement of any upstream tristate buffer, and for enabling said furthest downstream buffer when it is detected that no upstream tristate buffers have been enabled.

6. The circuit of claim 5 wherein said first logic means comprises:
    a first NAND gate having a first input coupled to receive said test mode signal and a second input coupled to receive a signal indicating enablement of any upstream tristate buffer; and
    a first AND gate having a first input coupled to an output of said first NAND gate and having a second input coupled to a first enable signal associated with said first downstream tristate buffer, an output of said first AND gate being coupled to an enable terminal of said first downstream tristate buffer.

7. The circuit of claim 6 wherein said second input of said NAND gate is coupled to an output of a first OR gate, wherein said first OR gate has a first input coupled to a second enable signal associated with a first upstream tristate buffer and has a second input coupled to receive a signal indicating enablement of a second upstream tristate buffer.

8. In a circuit including tristate buffers having outputs connected to a common bus, an improvement comprising:
    combinational logic means for causing at most one of said tristate buffers connected to said common bus to be enabled at any one time, said combinational logic means comprising a serial connection of logic gates for preventing enablement of a downstream tristate buffer upon enablement of any upstream tristate buffer, each of said logic gates within said serial connection of logic gates being associated with a different one of said tristate buffers, a first tristate buffer being considered upstream from a downstream tristate buffer if an output of a logic gate associated with said first tristate buffer directly or indirectly drives a logic gate associated with said downstream tristate buffer.

9. The circuit of claim 8 wherein there is no logic gate, within said serial connection of logic gates, associated with a most downstream tristate buffer.

10. The circuit of claim 8 wherein there is no logic gate, within said serial connection of logic gates, associated with a most upstream tristate buffer.

11. The circuit of claim 8 wherein said combinational logic incorporates logic for forcing enablement of a most downstream tristate buffer when none of said upstream tristate buffers is being enabled.

12. The circuit of claim 11 wherein forcing of enablement of said most downstream tristate buffer by said logic is inhibited by means of a control signal.

13. The circuit of claims 8 wherein prevention of enablement of downstream tristate buffers upon enablement of any upstream tristate buffers is inhibited by means of a control signal applied to an input terminal of said combinational logic.

* * * * *